United States Patent
Ooshiro et al.

(10) Patent No.: US 10,634,249 B2
(45) Date of Patent: Apr. 28, 2020

(54) PISTON RING AND ENGINE

(71) Applicants: NIPPON ITF, INC., Kyoto (JP); Honda Motor Co., Ltd., Tokyo (JP)

(72) Inventors: Takehiko Ooshiro, Kyoto (JP); Koji Miyake, Kyoto (JP); Masanori Tsujioka, Kyoto (JP); Satoshi Yoshida, Saitama (JP)

(73) Assignees: Nippon ITF, Inc., Kyoto (JP); Honda Motor Co., Ltd., Tokyo (JP)

( * ) Notice: Subject to any disclaimer, the term of this patent is extended or adjusted under 35 U.S.C. 154(b) by 95 days.

(21) Appl. No.: 15/751,157

(22) PCT Filed: Aug. 10, 2015

(86) PCT No.: PCT/JP2015/072681
§ 371 (c)(1),
(2) Date: Feb. 7, 2018

(87) PCT Pub. No.: WO2017/026042
PCT Pub. Date: Feb. 16, 2017

(65) Prior Publication Data
US 2018/0231125 A1    Aug. 16, 2018

(51) Int. Cl.
*F16J 9/26* (2006.01)
*C23C 16/02* (2006.01)
*C23C 16/26* (2006.01)

(52) U.S. Cl.
CPC ............ *F16J 9/26* (2013.01); *C23C 16/0281* (2013.01); *C23C 16/26* (2013.01)

(58) Field of Classification Search
USPC .................. 277/442; 428/408, 446, 457, 698
See application file for complete search history.

(56) References Cited

U.S. PATENT DOCUMENTS

2001/0031346 A1* 10/2001 Iwamura ............... C23C 28/046
                                                                    508/109
2012/0248711 A1* 10/2012 Iwashita ............. C23C 14/0605
                                                                    277/444
(Continued)

FOREIGN PATENT DOCUMENTS

CN       102575768         7/2012
EP        2851451      *   3/2015
(Continued)

OTHER PUBLICATIONS

Bai et al "Influence of duty cycle on microstructure, tribological and corrosion behaviors of a-C?a-C:Ti multilayers" Thin Solid Films 584 p. 214-221. (Year: 2015).*
(Continued)

*Primary Examiner* — Archene A Turner
(74) *Attorney, Agent, or Firm* — JCIPRNET (57) ABSTRACT

A piston ring in which carbon films with film qualities optimized to be adapted to required performance are formed on an outer circumferential sliding surface and top and bottom surfaces thereof with good productivity is provided, and a high-performance engine which employs the piston ring is also provided. In the piston ring, a carbon film is formed on an outer circumferential sliding surface and top and bottom surfaces. The carbon film contains a stacking of at least two types of carbon film layers with different film qualities, and a thickness ratio of the two types of carbon film layers is different between the outer circumferential sliding surface and the top and bottom surfaces.

15 Claims, 6 Drawing Sheets

(56) References Cited

U.S. PATENT DOCUMENTS

| | | | | |
|---|---|---|---|---|
| 2013/0136861 A1* | 5/2013 | Barenreuter | ........ | C23C 16/0272 |
| | | | | 427/249.18 |
| 2013/0252860 A1* | 9/2013 | Komori | ................ | C10M 141/10 |
| | | | | 508/108 |
| 2017/0002454 A1* | 1/2017 | Ozaki | ................... | C23C 14/025 |

FOREIGN PATENT DOCUMENTS

| | | | |
|---|---|---|---|
| JP | 2000-120869 | | 4/2000 |
| JP | 2000-120870 | | 4/2000 |
| JP | 3355306 | | 12/2002 |
| JP | 2008-001951 | * | 1/2008 |
| JP | 2008-241032 | | 10/2008 |
| JP | 2011-133018 | | 7/2011 |
| JP | 5013445 | | 8/2012 |
| WO | 2012073717 | | 6/2012 |
| WO | 2015115601 | | 8/2015 |

OTHER PUBLICATIONS

Xu et al "The microstructure and mechanical roperties of multlayer diamond-like carbon films with different modulation ratios" Apllied Surface Science p. 207-212. (Year: 2013).*

"Office Action of China Counterpart Application", dated Mar. 29, 2019, with English translation thereof, p. 1-p. 14.

"International Search Report (Form PCT/ISA/210) of PCT/JP2015/072681", dated Oct. 27, 2015, with English translation thereof, pp. 1-3.

"Office Action of China Counterpart Application," with English translation thereof, dated Nov. 20, 2019, p. 1-p. 10.

* cited by examiner

PISTON RING AND ENGINE

CROSS-REFERENCE TO RELATED APPLICATION

This application is a 371 application of the international PCT application serial no. PCT/JP2015/072681, filed on Aug. 10, 2015. The entirety of the above-mentioned patent application is hereby incorporated by reference herein and made a part of this specification.

TECHNICAL FIELD

The invention relates to a piston ring and an engine, and more particularly, to a piston ring in which a carbon film is formed on an outer circumferential sliding surface and top and bottom surfaces and an engine which employs the piston ring.

BACKGROUND ART

In an engine of a vehicle or the like, a piston ring is mounted on a piston and the piston ring is caused to slide over a wall surface of a sleeve (a cylinder) which is an opposite member. Accordingly, low friction and abrasion resistance are required for the piston ring, and a carbon film of diamond-like carbon (DLC) or the like has been formed on an outer circumferential sliding surface of the piston ring in the related art.

However, with recent increases in output power and rotation speed of engines, use of a piston formed of an aluminum (Al) alloy as a piston, and the like, there is a problem with abrasion of a piston ring groove. Therefore, in order to cope with this problem, techniques of forming a carbon film of diamond-like carbon or the like on top and bottom surfaces of a piston ring in addition to the outer circumferential sliding surface thereof have been studied (for example, see Patent Literatures 1 to 5).

At this time, formation of a carbon film on a piston ring is normally performed in a state in which a plurality of piston rings are arranged in a chamber of film formation equipment. However, the outer circumferential sliding surface and the top and bottom surfaces require different characteristics of the carbon films formed thereon. For example, low friction with a sleeve which is an opposite sliding member in addition to abrasion resistance is required for the outer circumferential sliding surface. On the other hand, low attackability and adhesion resistance for preventing burning due to scratching of a piston ring groove based on wobbling of the piston ring during operation in addition to abrasion resistance are required for the top and bottom surfaces.

Accordingly, in Patent Literatures 1 to 4, based on the premise that a film is formed on the outer circumferential sliding surface and the top and bottom surfaces of a piston ring under the same treatment conditions, the outer circumferential sliding surface and the top and bottom surfaces have the same film quality and have only a difference in a film-forming state depending on set positions at the time of film formation, and it cannot be said that satisfactory film formation corresponding to different characteristics required for the outer circumferential sliding surface and the top and bottom surfaces is performed.

Therefore, an example of a technique of forming carbon films with film qualities corresponding to different characteristics required for the outer circumferential sliding surface and the top and bottom surfaces of the piston ring has been proposed in Patent Literature 5. Specifically, in Patent Literature 5, when a hard carbon film is formed by plasma CVD, carbon films with different film qualities are simultaneously formed on the outer circumferential sliding surface and the top and bottom surfaces by setting piston rings in a chamber such that the top and bottom surfaces of the piston rings are parallel to an ion flow from a plasma source and the outer circumferential surfaces are perpendicular to the ion flow.

However, in this case, since the piston rings need to be arranged with an increased gap between the top and bottom surfaces of the piston rings such that film-forming states of the carbon films which are formed on the surfaces are not affected, the number of piston rings which can be arranged in one chamber may decrease and cause a decrease in productivity. Even when a plurality of piston rings are arranged in this way, it is not easy to optimize different film qualities for the outer circumferential sliding surface and the top and bottom surfaces.

REFERENCE LIST PATENT LITERATURE

Patent Literature 1: Japanese Patent Application Laid-Open (JP-A) No. 2000-120869
Patent Literature 2: Japanese Patent Application Laid-Open (JP-A) No. 2000-120870
Patent Literature 3: Japanese Patent No. 5013445
Patent Literature 4: Japanese Patent No. 3355306
Patent Literature 5: Japanese Patent Application Laid-Open (JP-A) No. 2008-241032

SUMMARY

Technical Problem

Therefore, an object of the invention is to provide a piston ring in which carbon films with film qualities optimized to be adapted to required performance are formed on an outer circumferential sliding surface and top and bottom surfaces thereof with good productivity and to provide a high-performance engine which employs the piston ring.

Solution to Problem

The inventor has carried out various experiments and studies to achieve the above-mentioned object and focused on the fact that characteristics of stacked carbon films can be controlled by changing a thickness ratio of two types of carbon film layers with different film qualities (characteristics) when a carbon film is formed by forming and stacking two types of carbon film layers with different film qualities (characteristics) on a single surface.

The inventor found that carbon films with different film qualities can be formed on the outer circumferential sliding surface and the top and bottom surfaces by only stacking two types of carbon film layers with different thickness ratios for the outer circumferential sliding surface and the top and bottom surfaces even by simple means for adjusting the thickness ratios of the carbon film layers.

The inventor found that the thickness ratios of the outer circumferential sliding surface and the top and bottom surfaces can be appropriately adjusted by stacking the carbon film layers under appropriate control, and thus a piston ring in which adaptive carbon films are formed on the top and bottom surfaces and the outer circumferential sliding surface can be obtained.

The invention is based on the above-mentioned knowledge and the invention according to item 1 is a piston ring in which a carbon film is formed on an outer circumferential sliding surface and top and bottom surfaces, wherein the carbon film is a formed by stacking at least two types of carbon film layers with different film qualities are stacked, and a thickness ratio of the two types of carbon film layers is different between the outer circumferential sliding surface and the top and bottom surfaces.

The inventor has studied a specific method of forming a carbon film in which a thickness ratio of the carbon film layers on the outer circumferential sliding surface and a thickness ratio of the carbon film layers on the top and bottom surfaces are different with good productivity.

In order to improve productivity, it is preferable that the carbon film layers be formed with a plurality of piston rings arranged adjacent to each other in a chamber such that the top and bottom surfaces face each other.

Therefore, at the time of formation of the carbon film layers, the inventor paid attention to favorability and disfavorability of deposition at the time of formation of the carbon film layers. Here, "favorable deposition" means that a carbon film layer can be sufficiently formed on a substrate even with a small gap by increasing a plasma density and narrowing a plasma sheath, and can be realized, for example, by taking means for increasing a pressure using a decomposable gas as a source gas and decreasing a bias voltage. "Disfavorable deposition," in contrast, means that a carbon film layer cannot be sufficiently formed on a substrate with a small gap by decreasing a plasma density and widening a plasma sheath, and can be realized, for example, by taking means for decreasing a pressure using non-decomposable gas as source gas and increasing a bias voltage.

Specifically, when the first carbon film layer is first formed on the top and bottom surfaces and the outer circumferential sliding surface under film formation conditions favorable for deposition, plasma enters the adjacent top and bottom surfaces and thus the first carbon film layer can be formed on the top and bottom surfaces with a sufficient thickness.

When the second carbon film layer is then formed on the top and bottom surfaces and the outer circumferential sliding surface under film formation conditions disfavorable for deposition, plasma does not enter the adjacent top and bottom surfaces sufficiently and thus it is difficult to form the second carbon film layer on the top and bottom surfaces. Accordingly, the thickness ratio of the second carbon film layer to the first carbon film layer decreases on the top and bottom surfaces.

Meanwhile, the first carbon film layer formed under the conditions favorable for deposition and the second carbon film layer formed under the conditions disfavorable for deposition can both be formed with sufficient thicknesses on the outer circumferential sliding surface. Accordingly, the thickness ratio of the second carbon film layer to the first carbon film layer does not decrease on the outer circumferential sliding surface.

As a result, since the thickness ratio of the second carbon film layer to the first carbon film layer (hereinafter also referred to as an "upper-layer thickness ratio" because the second carbon film layer is a carbon film layer which is formed as an upper layer) can be set to be larger on the outer circumferential sliding surface than on the top and bottom surfaces, the film quality of the second carbon film layer can be exhibited on the outer circumferential sliding surface and the film quality of the first carbon film layer can be exhibited on the top and bottom surfaces.

At this time, when the first carbon film layer is set to be a carbon film layer adapted to the film quality (for example, low attackability) required for the top and bottom surfaces, the second carbon film layer is set to be a carbon film layer adapted to the film quality (for example, low friction) required for the outer circumferential sliding surface, and the upper-layer thickness ratio is set to be higher on the outer circumferential sliding surface than on the top and bottom surfaces as described above, the film quality of the second carbon film layer can be exhibited on the outer circumferential sliding surface, that is, the film quality (for example, low friction) required for the outer circumferential sliding surface can be exhibited, and the film quality of the first carbon film layer can be exhibited on the top and bottom surfaces, that is, the film quality (for example, low attackability) required for the top and bottom surfaces can be exhibited. As a result, it is possible to provide a piston ring in which a carbon film with film qualities optimized for the top and bottom surfaces and the outer circumferential sliding surface is formed with good productivity.

Specifically, a preferable example of the carbon film layer which can exhibit the low attackability required for the top and bottom surfaces is a carbon film layer which does not easily react with a metal or the like, does not easily adhere to iron (Fe) or Al, has a total content of carbon (C) and hydrogen (H) of 80 at % or more, and mostly includes only C and H, and the total content of C and H is more preferably equal to or greater than 90 at %. In order to secure durability of the carbon film layer, nanoindentation hardness of the first carbon film layer is preferably equal to or greater than 15 GPa and more preferably equal to or greater than 20 GPa.

In a carbon film in which a Raman coefficient (a Raman evaluation coefficient) which is calculated from the following equation is equal to or less than 36.3, when a sleeve which is an opposite sliding member is an Al alloy, a friction coefficient thereof is lower than the friction coefficient of a piston coated with CrN which is currently widely used. Accordingly, the second carbon film layer which can exhibit the low friction required for the outer circumferential sliding surface is preferably a carbon film with a Raman coefficient of equal to or less than 36.3. In such a carbon film layer, the total content of C and H is preferably equal to or greater than 80 at % and more preferably equal to or greater than 90 at %.

$$\text{Raman coefficient} = 10^6 \div (\text{peak position} \times 1.08 + \text{half-value width}) - 510$$

Peak position: wavelength at vertex of G peak ($cm^{-1}$)

Half-value width: half-value width of G peak ($cm^{-1}$)

By stacking the first carbon film layer and the second carbon film layer such that the upper-layer thickness ratio is higher on the outer circumferential sliding surface than on the top and bottom surfaces as described above, the carbon film on the outer circumferential sliding surface can be formed as a carbon film with excellent low friction and the carbon film on the top and bottom surfaces can be formed as a carbon film with excellent low attackability.

When both the first carbon film layer and the second carbon film layer are carbon film layers of which the total content of C and H is equal to or greater than 80 at %, it is possible to prevent adhesion from occurring on the top and bottom surfaces and causing abrasion of a piston ring groove on the top and bottom surfaces and to prevent occurrence of adhesion to a sleeve (a cylinder) formed of an Al alloy on the outer circumferential sliding surface.

The inventions according to items 2 to 4 are based on the above-mentioned knowledge and the invention according to item 2 is the piston ring according to item 1, wherein the carbon film is formed by stacking a first carbon film layer formed on a piston ring body side and a second carbon film layer formed on an outer surface side, a thickness of the second carbon film layer on the top and bottom surfaces is smaller than a thickness of the second carbon film layer on the outer circumferential sliding surface, and a ratio of the thickness of the second carbon film layer to the thickness of the first carbon film layer is larger on the outer circumferential sliding surface than on the top and bottom surfaces.

The invention according to item 3 is the piston ring according to item 2, wherein the thickness of the first carbon film layer on the top and bottom surfaces is larger than the thickness of the second carbon film layer.

The invention according to item 4 is the piston ring according to item 2 or 3, wherein a Raman coefficient of the second carbon film layer which is calculated from the following equation on the basis of a Raman spectrum is equal to or less than 36.3, Raman coefficient=$10^6$÷(peak position×1.08+half-value width)−510 peak position: wavelength at vertex of G peak ($cm^{-1}$)
half-value width: half-value width of G peak ($cm^{-1}$).

The invention according to item 5 is the piston ring according to any one of items 2 to 4, wherein at least the first carbon film layer is a carbon film layer which is formed using plasma CVD.

Since plasma CVD is a film formation method using a gas as a raw material, generated plasma can enter a narrow gap to improve deposition and the plasma CVD can be preferably used as a film formation method of the first carbon film layer.

Even when a plurality of piston rings are set with a small gap such that the top and bottom surfaces thereof face each other, the first carbon film layer can be more satisfactorily formed on the top and bottom surfaces, the thickness of the first carbon film layer on the top and bottom surfaces can be set to be larger than the thickness of the second carbon film layer, and the upper-layer thickness ratio on the outer circumferential sliding surface can be easily controlled such that it is higher than the upper-layer thickness ratio on the top and bottom surfaces.

By using a gas as a raw material, it is possible to easily form the first carbon film layer of which the total content of C and H is equal to or greater than 80 at %.

The invention according to item 6 is the piston ring according to item 5, wherein the first carbon film layer and the second carbon film layer are formed on two or more piston rings which are arranged in a chamber using plasma CVD such that the top and bottom surfaces are parallel to each other under a condition in which a second outer circumferential layer thickness ratio is larger than a first outer circumferential layer thickness ratio, wherein the second outer circumferential layer thickness ratio is a ratio of the thickness on the outer circumferential sliding surface of the second carbon film layer to the thickness on the top and bottom surfaces of the second carbon film layer, and the first outer circumferential layer thickness ratio is a ratio of the thickness on the outer circumferential sliding surface of the first carbon film layer to the thickness on the top and bottom surfaces of the first carbon film layer.

By consistently forming film layers under the above-mentioned conditions using plasma CVD, it is possible to provide a piston ring in which carbon films with different film qualities adapted to the film qualities required for the top and bottom surfaces and the outer circumferential sliding surface are formed with good productivity.

The invention according to item 7 is the piston ring according to item 6, wherein the first carbon film layer and the second carbon film layer are formed by arranging a part of the top and bottom surfaces or inner circumferential surfaces of the two or more piston rings in a state of being held by a holder.

When entire inner circumferential surfaces of two or more piston rings are brought into contact with a holder like a cylindrical holder, plasma is not generated inside the piston ring and thus deposition deteriorates at the time of formation of the first carbon film layer. On the other hand, when the entire top and bottom surfaces or the entire inner circumferential surface of the piston ring is not brought into contact with the holder but only a part thereof is held by the holder, plasma can be generated inside the piston ring and thus it is possible to reduce the deterioration in deposition.

The invention according to item 8 is the piston ring according to item 6 or 7, wherein at least the second carbon film layer of the first carbon film layer and the second carbon film layer is formed using plasma CVD equipment other than a self-discharge type.

As described above, the first carbon film layer and the second carbon film layer can be consistently formed using the plasma CVD. However, in the case of self-discharge type plasma CVD equipment, when it is intended to form the second carbon film layer after the first carbon film layer is formed, the first carbon film layer that is formed already is an insulator and thus it may be difficult to generate plasma to form the second carbon film layer. A plasma state may vary greatly and it may be difficult to freely select treatment conditions.

On the other hand, when a coating device having a plasma source is used to form at least the second carbon film layer, treatment conditions of the first carbon film layer and the second carbon film layer can be relatively freely selected, which is preferable.

The invention according to claim 9 is the piston ring according to claim 8, wherein PIG discharge plasma CVD equipment is used as a coating device.

Since the penning ionization gauge (PIG) discharge plasma CVD can preferentially realize a strong discharge state at a narrow pitch and can generate uniform plasma with a high density, it is possible to form a carbon film layer with more favorable deposition at the time of formation of the first carbon film layer.

The invention according to item 10 is the piston ring according to item 4 or 5, wherein the second carbon film layer is formed using any one of PVD of sputtering or ion plating in a state in which the piston ring body is arranged such that the outer circumferential sliding surface is perpendicular to an ion flow from a plasma source and the top and bottom surfaces are parallel to the ion flow.

PVD is a film formation method with disfavorable deposition, and the second carbon film layer can be formed with a large thickness on the outer circumferential sliding surface and with a small thickness on the top and bottom surfaces by forming the second carbon film layer on the first carbon film layer which is formed with favorable deposition using the plasma CVD using a gas as a raw material in a state in which the piston ring body is arranged such that the outer circumferential sliding surface is perpendicular to the ion flow from the plasma source and the top and bottom surfaces are parallel to the ion flow.

The invention according to item 11 is the piston ring according to any one of items 1 to 10, wherein a metal layer containing titanium or chromium is formed on a surface of the piston ring using sputtering before the carbon film is formed.

Since a metal layer containing titanium (Ti) or chromium (Cr) has better adhesion to an iron material than a carbon film, it is possible to satisfactorily secure adhesion of the first carbon film layer by forming the metal layer before forming the carbon film layer.

The invention according to item 12 is the piston ring according to any one of items 1 to 10, wherein a carbon layer containing silicon is formed using CVD using a mixed gas containing a silane-based gas before the carbon film layer is formed.

Since the first carbon film layer does not need to easily adhere to iron (Fe) or aluminum (Al), it is difficult to secure adhesion to the surface of the piston ring, but it is possible to secure satisfactory adhesion by forming a carbon film containing silicon using CVD using a mixed gas containing a silane-based gas under the conditions favorable for adhesion on the surface of the piston ring before forming the first carbon film layer.

Since the carbon film layer containing silicon is formed using the CVD, it is possible to secure adhesion on the top and bottom surfaces.

The invention according to item 13 is the piston ring according to any one of items 1 to 10, wherein, before the carbon film is formed, a metal layer containing titanium or chromium is formed on a surface of the piston ring using sputtering and then a carbon film layer containing silicon is formed thereon using CVD using a mixed gas containing a silane-based gas.

By forming layers having better adhesion to the surface of the piston ring than the carbon film in the order of the metal layer based on sputtering and the carbon film layer containing silicon based on the CVD, satisfactory adhesion of the sliding surface can be obtained by the metal layer and the carbon film layer containing silicon, and satisfactory adhesion of the top and bottom surfaces can be obtained by the carbon film layer containing silicon.

The invention according to item 14 is the piston ring according to any one of items 1 to 13, wherein a material of an opposite member which slides over at least one of the outer circumferential sliding surface and the top and bottom surfaces of the piston ring is an aluminum alloy.

In the piston ring according to the invention, the carbon film in which the first carbon film layer having good low attackability and the second carbon film layer having good low friction are stacked is formed on the outer circumferential sliding surface and the top and bottom surfaces at different thickness ratios.

Accordingly, even when an opposite sliding member is formed of an aluminum (Al) alloy which is easily abraded and easily attached to the piston ring, it is possible to curb occurrence of burning which occurs due to wobbling of the piston ring.

The invention according to item 15 is the piston ring according to item 14, wherein the piston ring is used in an environment in which a lubricant containing a sulfurized molybdenum dialkyldithiocarbamate is used.

In the case of sliding over an Al alloy, since abnormal abrasion is not caused in a lubricant containing a Mo-DTC, the advantageous effects of the invention are exhibited more remarkably.

The invention according to claim 16 is an engine employing the piston ring according to any one of claims 1 to 15.

By employing the above-mentioned piston ring according to the invention, for example, low attackability and low friction can be exhibited in a sliding part between the piston ring and a piston or sleeve, and it is possible to provide a high-performance engine which is suitable for an increase in output power, an increase in rotation speed, or a decrease in weight.

Advantageous Effects of Invention

According to the invention, it is possible to provide a piston ring in which carbon films with film qualities optimized to be adapted to required performance are formed on an outer circumferential sliding surface and top and bottom surfaces thereof with good productivity and to provide a high-performance engine which employs the piston ring.

DESCRIPTION OF THE EMBODIMENTS

Hereinafter, embodiments of the invention will be described. In the following description, it is assumed that carbon film layers which are formed are two layers including a first carbon film layer having excellent low attackability and a second carbon film layer having excellent low friction.

1. Piston Ring (1) Entire Configuration

Figure 1:
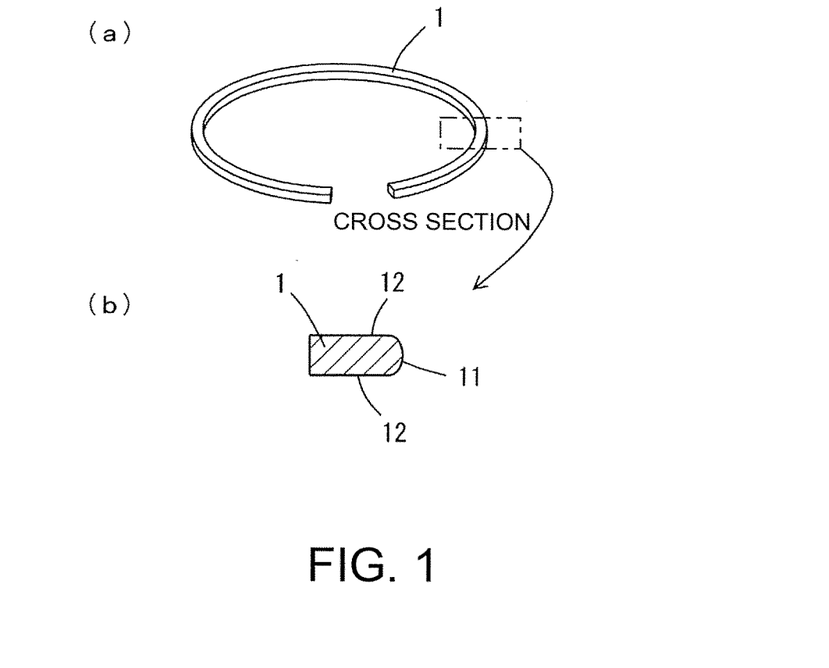
FIG. 1 is a diagram illustrating a piston ring, where (a) of FIG. 1 and (b) of FIG. 1 are a perspective view and a cross sectional view of a piston ring.

First, a piston ring will be described below. FIG. 1 is a diagram illustrating a piston ring, where (a) of FIG. 1 and (b) of FIG. 1 are a perspective view and a cross sectional view. As illustrated in FIG. 1, an outer circumferential sliding surface 11 which slides over a sleeve and a top and bottom surface 12 coming into contact with a ring groove of a piston are formed in the piston ring 1.

The piston ring according to an embodiment, two carbon film layers with different film qualities including a first carbon film layer having excellent low attackability which is first formed as a lower layer and a second carbon film layer having excellent low friction which is formed later as an upper layer are stacked to form a carbon film on the outer circumferential sliding surface 11 and the top and bottom surface 12.

The thickness of the second carbon film layer in the carbon film on the top and bottom surface 12 is smaller than the thickness of the second carbon film layer of the carbon film on the outer circumferential sliding surface 11, and a ratio (an upper-layer thickness ratio) of the thickness of the second carbon film layer to the thickness of the first carbon film layer is larger on the outer circumferential sliding surface 11 than on the top and bottom surface 12.

In this way, by stacking two carbon film layers with different film qualities on the outer circumferential sliding surface 11 and the top and bottom surface 12 of the piston ring 1 while changing the thickness ratio and setting the thickness ratio of the second carbon film layer to the first carbon film layer to be higher on the outer circumferential sliding surface than on the top and bottom surface, a carbon film with excellent low friction is formed on the outer circumferential sliding surface 11 of the piston ring 1 and a carbon film with excellent low attackability is formed on the top and bottom surface 12.

(2) Piston Ring Body

A piston ring body which was used in the related art can be used, and the material thereof is not particularly limited. For example, iron materials such as a stainless steel material, a cast metal material, a cast steel material, and a steel material can be used. Nitriding treatment is performed on the surface or Cr plating or CrN coating may be performed on the surface.

In order to improve adhesion to a carbon film, it is preferable that surface treatment which will be described later be appropriately performed.

An example thereof is surface treatment of forming a metal layer containing Ti or Cr on the surface of the piston ring body using sputtering in advance. In this case, the thickness of the metal layer and the like are adjusted to obtain suitable adhesion to a carbon film using a known technique.

Another example thereof is surface treatment of forming a carbon film layer containing Si on the surface of the piston ring body by CVD using mixed gas containing silane-based gas in advance. In this case, the thickness of the carbon film layer containing Si is appropriately determined such that satisfactory adhesion to the carbon film layer can be achieved.

Another example thereof is surface treatment of forming a carbon film layer containing Si by CVD using mixed gas containing silane-based gas after forming a metal layer by sputtering.

The thicknesses of the layers which are formed by the above-mentioned surface treatment are appropriately determined such that satisfactory adhesion to a carbon film which is formed on the surface treatment layers can be achieved.

(3) Carbon Film Layer a. First Carbon Film Layer

As described above, a carbon film layer with excellent low attackability is formed as the first carbon film layer. As such a carbon film layer, a carbon film layer of which the total content of C and H is equal to or greater than 80 at % can be preferably used and a carbon film layer containing only C and H can be more preferably used.

The first carbon film layer more preferably includes only C and H from the point of view of low attackability, but may include a small amount of Si to enhance adhesion to the piston ring body, to improve abrasion resistance, and to reduce attackability.

For example, recently, a lubricant containing a Mo-DTC has often been used as a lubricant for an engine, and when a carbon film formed of a carbon film layer containing only C and H is used for such an application, there is concern that abnormal abrasion will occur, but occurrence of abnormal abrasion can be prevented by containing a small amount of Si.

In order to satisfactorily secure durability of the first carbon film layer, it is preferable that the first carbon film layer have nanoindentation hardness of 20 GPa or more.

b. Second Carbon Film Layer

As described above, a second carbon film layer with excellent low friction is formed as the second carbon film layer. For example, a carbon film layer with a Raman coefficient of 36.3 or less can be preferably used as such a carbon film layer as described above. When at least a sleeve serving as an opposite sliding member is formed of an Al alloy, it is preferable that the total content of C and H be equal to or greater than 80 at %, similarly to the first carbon film layer.

c. Formation of Carbon Film

A specific method of forming a carbon film in which the first carbon film layer and the second carbon film layer are stacked will be described below as an example.

A. Formation of First Carbon Film Layer

The first carbon film layer is formed by a plasma CVD method after a plurality of piston rings 1 are arranged in parallel in a chamber of PIG discharge plasma CVD equipment such that the top and bottom surfaces 12 face each other in parallel.

Since the film formation method using the PIG discharge plasma CVD equipment provides good deposition and can form a uniform film on surfaces which are arranged with a small gap, the first carbon film layer can be satisfactorily formed on both the outer circumferential sliding surface 11 and the top and bottom surface 12 of the piston ring 1. In order to decompose source gas into atoms, molecules, and ions which are active at high efficiency and to form a film, atoms, molecules, and ions which are generated by applying a DC pulse to a substrate can be deposited with irradiation with high energy and thus a carbon film layer with excellent adhesion can be formed.

Figure 2:
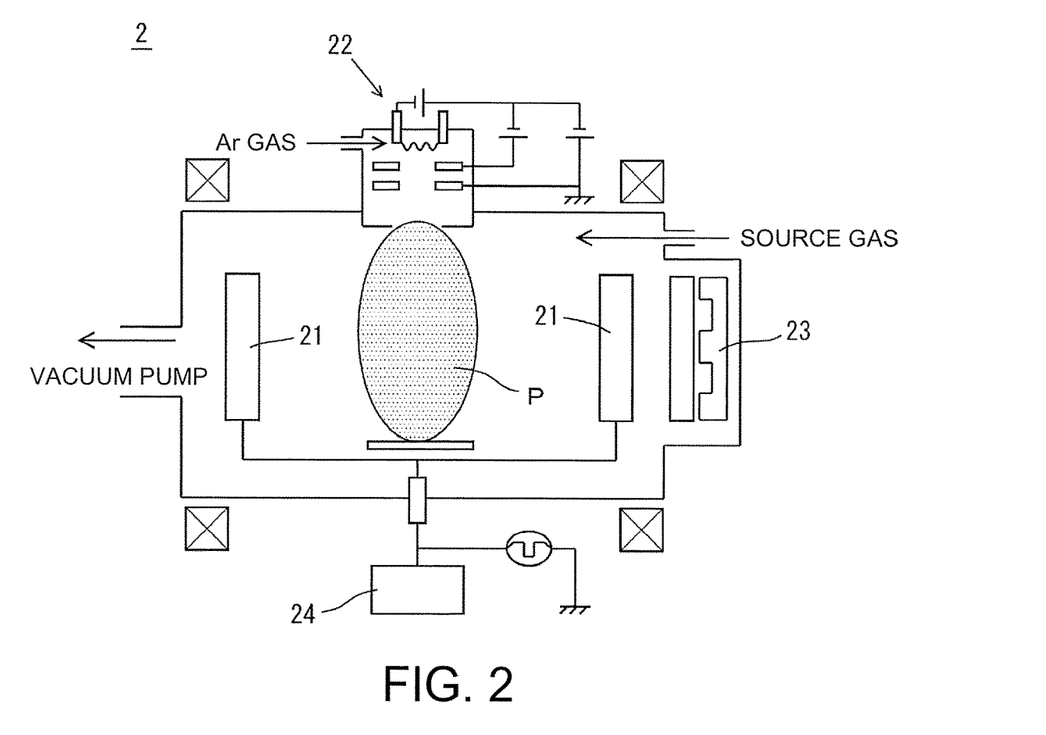
FIG. 2 is a diagram schematically illustrating a configuration of carbon film formation equipment according to an embodiment of the invention.
Figure 3:
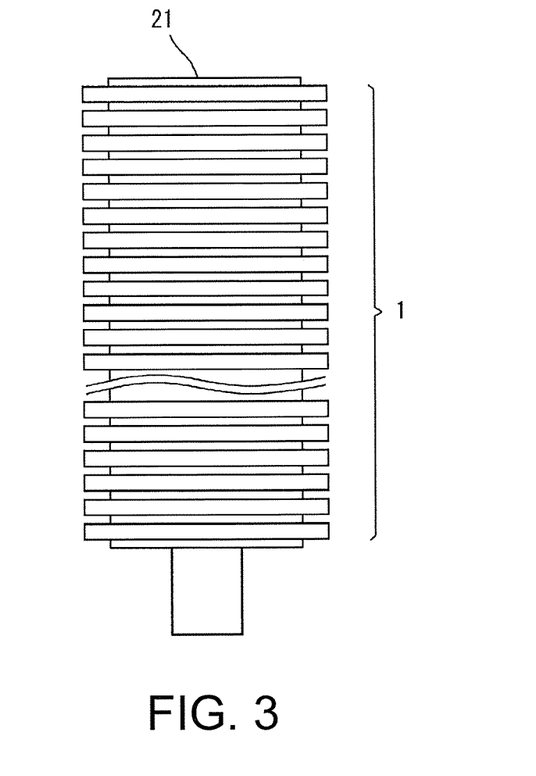
FIG. 3 is a side view illustrating a state in which a piston ring is set on a substrate of the carbon film formation equipment.
Figure 4:
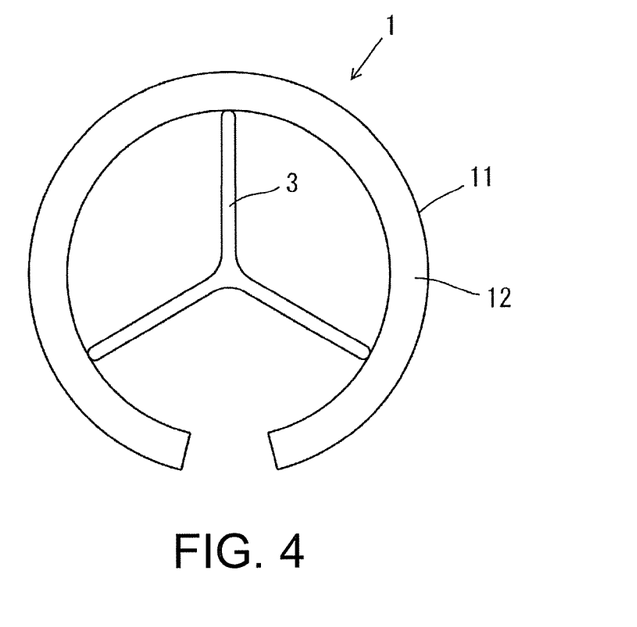
FIG. 4 is a plan view schematically illustrating a shape of a holder according to an embodiment of the invention.

FIG. 2 is a diagram schematically illustrating a configuration of the PIG discharge plasma CVD equipment. A substrate 21, a PIG gun 22, a sputter gun 23, a motor 24 connected to a support supporting the substrate 21, and a chamber are provided in the PIG discharge plasma CVD equipment 2. A gas supply port of argon (Ar) gas which is introduction gas is provided in the PIG gun 22, and an exhaust port connected to a vacuum pump and a gas supply port of source gas are provided in the chamber. FIG. 3 is a side view illustrating a state in which a plurality of piston rings are set on the substrate 21. FIG. 4 is a plan view schematically illustrating a shape of a holder 3 which is used to set the piston rings 1 for the substrate at predetermined intervals.

A plurality of piston rings 1 which are fitted with the holder 3 and set for the substrate 21 vertically standing in a state in which the piston rings are subjected to pre-treatment for cleaning the surfaces thereof before forming the first carbon film layer. Specifically, by exhausting the chamber to a predetermined degree of vacuum and then supplying Ar gas at a predetermined flow rate and operating the PIG gun to discharge thermal electrons, Ar plasma is generated. Then, by rotating the substrate 21 about the Ar plasma with the motor 24 for a predetermined time while applying a predetermined bias voltage to the substrate 21, the piston rings 1 are irradiated with Ar ions to etch the surfaces of the piston rings 1. Accordingly, the surfaces of the piston rings 1 are cleaned.

Then, Ar gas and source gas such as hydrocarbon gas are introduced into the chamber at a predetermined flow rate, plasma P including raw material plasma is generated in the chamber, and a predetermined bias voltage is applied to the substrate 21 to irradiate the piston rings 1 subjected to the pre-treatment with the plasma P for a predetermined time. Accordingly, the first carbon film layer is formed on both the outer circumferential sliding surface 11 and the top and bottom surface 12.

When acetylene, benzene, toluene, methane, cyclohexane, ethane, or the like is used as the hydrocarbon gas which is the source gas, a carbon film layer of which the total content of C and H is equal to or greater than 80 at % can be formed. In order to add Si in a range in which the total cent of C and H is not less than 80 at %, silane-based gas such as monomethyl silane or tetramethyl silane (TMS) may be mixed.

In the PIG discharge plasma CVD equipment, for example, as illustrated in FIG. 4, a holder 3 that holds only a part of the top and bottom surface 12 of the piston ring 1 can be preferably used as the holder that holds the piston ring 1. By employing such a holder, plasma can easily enter the inside and deposition of a carbon film on the top and bottom surface 12 of the piston ring 1 is improved.

B. Formation of Second Carbon Film Layer

When formation of the first carbon film layer is completed, the second carbon film layer is subsequently formed on the first carbon film layer. Here, the second carbon film layer is formed under the film formation conditions with worse deposition than that at the time of forming the first carbon film layer. Accordingly, the second carbon film layer can be formed on the outer circumferential sliding surface 11, and plasma does not sufficiently enter narrow gaps between the top and bottom surfaces 12 and thus formation of the second carbon film layer is curbed.

At this time, deposition may be made to be worse by setting a low plasma density in the chamber and a thick plasma sheath depending on conditions such as a voltage applied to the substrate and a gas pressure, but an environment with disfavorable deposition can be more easily achieved by using hydrocarbon gas which is less decomposable than hydrocarbon gas which is used for the first carbon film layer as the hydrocarbon gas.

When the second carbon film layer is formed using the hydrocarbon gas, a carbon film layer of which the total content of C and H is equal to or greater than 80 at % can be formed, but silane-based gas such as monomethyl silane or tetramethyl silane (TMS) may be mixed to add Si.

In the above description, the first carbon film layer and the second carbon film layer are consistently formed using the PIG discharge plasma CVD equipment, but this is only an example. For example, plasma CVD equipment other than a self-discharge type may be used to form the second carbon film layer.

In this case, since a plasma source is separately provided, a degree of freedom in treatment conditions is increased, a problem at the time of forming the second carbon film layer using the self-discharge type plasma CVD equipment, that is, a problem in that a plasma state at the time of forming the second carbon film layer varies greatly due to large electrical resistance of the first carbon film layer which has been previously formed and thus treatment conditions cannot be freely selected, does not occur, and the second carbon film layer can be formed under suitable conditions in which the film quality has greater importance.

At the time of forming the second carbon film layer, PVD such as sputtering or ion plating may be employed as a film formation method with disfavorable deposition. In this case, the second carbon film layer is formed by arranging the piston ring 1 such that the outer circumferential sliding surface 11 is perpendicular to an ion flow from a plasma source and the top and bottom surface 12 is parallel to the ion flow and making it difficult for ions to enter between the top and bottom surfaces facing each other. The sputter gun 23 which is used for sputtering is illustrated in FIG. 2.

2. Engine

An engine according to this embodiment is used for vehicles, ships, or various other equipment and devices, and can be suitably used as a recent vehicle engine in which an increase in output power and an increase in rotation speed are achieved using a piston formed of an Al alloy, because the above-mentioned piston ring including the outer circumferential sliding surface with excellent low friction and the top and bottom surfaces with excellent low attackability is used.

The piston and the sleeve of the engine are not limited to the Al alloy, the type of a lubricant is not particularly limited, and it is possible to optimize the film quality of the carbon film of the piston ring depending on the use conditions.

EXAMPLES

Hereinafter, an experiment (Experiment 1) for evaluating the film qualities of the carbon film layers, an experiment (Experiment 2) for evaluating the film qualities of the carbon films on the surfaces of the piston ring in which the carbon film layers are stacked to form the carbon films, an experiment (Experiment 3) for evaluating changes in attackability and durability due to addition of Si to the carbon film layers, and an experiment (Experiment 4) for evaluating performance of various types of second carbon film layers with different Raman coefficients under base oil (a lubricant) will be sequentially described to more specifically explain the invention.

[1] Experiment 1

In Experiment 1, a member in which carbon film layers (carbon film layer 1 and carbon film layer 2) corresponding to the first carbon film layer and the second carbon film layer were individually formed on a substrate which is supposed as a piston ring was manufactured as a test sample and the film qualities of the carbon film layers were evaluated.

1. Manufacturing of Test Sample

First, carbon film layer 1 with a thickness of 6 µm was formed on a cylindrical substrate formed of SUJ-2 in which a Ti layer with a thickness of 0.6 µm based on sputtering and a Si-DLC layer with a thickness of 0.6 µm based on a CVD method using mixed gas of TMS and acetylene were sequentially formed as an adhesion layer, using the PIG discharge plasma CVD equipment under the film formation conditions with good deposition, and the resultant structure was used as a first test sample. Specifically, film formation was performed for 2 hours and 15 minutes using 20 ccm of Ar gas and 75 ccm of hydrocarbon gas A (such as acetylene, toluene, or benzene) as introduction gas under film formation conditions of a gas pressure of 0.4 Pa, a substrate bias voltage of −500 V, and a discharge current of 5 A.

Then, carbon film layer 2 with a thickness of 4 μm was formed on the cylindrical substrate formed of SUJ-2 in which the same adhesion layer as in the first test sample was formed under the film formation conditions with disfavorable deposition using the PIG discharge plasma CVD equipment, and the resultant structure is used as a second test sample. Specifically, film formation was performed for 3 hours and 45 minutes using 20 ccm of Ar gas and 80 ccm of hydrocarbon gas B (such as cyclohexane, methane, or ethane) as introduction gas under film formation conditions of a gas pressure of 0.4 Pa, a substrate bias voltage of −500 V, and a discharge current of 10 A.

The total contents of C and H of the formed carbon film layers were all equal to or greater than 80 at %.

2. Test Method

A friction coefficient and hardness (nanoindentation hardness) were measured for the carbon film layers formed on the obtained two test samples.

(1) Measurement of Friction Coefficient

Figure 5:
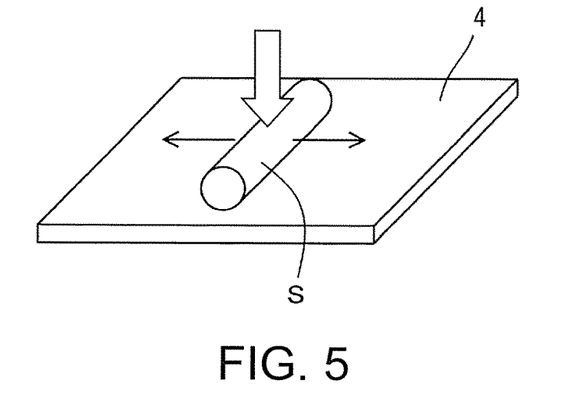
FIG. 5 is a perspective view illustrating a method of measuring a friction coefficient of a carbon film.

The friction coefficients of the formed carbon film layers were measured using the measurement method illustrated in FIG. 5. Specifically, under an environment of engine oil with viscosity SAE 0W-20 based on ILSAC GF-5 grade, a carbon film layer formation surface S of each test sample was caused to slide in a lateral direction (a direction perpendicular to the length direction of the cylindrical substrate) along an arrow with amplitude of 2 mm at 10 Hz while it was being pressed against the plate substrate 4 formed of SUJ-2 with a load of 40 N, and the friction coefficient at that time was measured.

(2) Measurement of Hardness (Nanoindentation Hardness)

Nanoindentation hardness for each carbon film layer was measured with a measurement load of 300 mgf using an indentation hardness meter (ENT-1100a) made by ELIONIX Inc.

3. Result

Measurement results of the friction coefficient and hardness along with treatment conditions for film formation (film formation conditions) are described in Table 1.

carbon films on the outer circumferential sliding surface and the top and bottom surface were evaluated.

1. Manufacturing of Test Sample

First, 186 piston rings formed of stainless nitride steel with an outer diameter 76 mm, a width of 2.5 mm, and a thickness of 1.2 mm were prepared, and were arranged in a chamber such that the top and bottom surfaces face each other in parallel with a gap of 2 mm. The holder 3 illustrated in FIG. 4 was used as a holder that holds the piston rings.

Before forming the first carbon film layer, treatment of forming an adhesion layer including a Ti layer and a Si-containing carbon film on the surfaces of the piston rings was performed.

Then, the first carbon film layer was formed on the outer circumferential sliding surface and the top and bottom surface of each treated piston ring under the same film formation conditions as forming the Carbon film layer 1 in Experiment 1, and then the second carbon film layer was formed on the first carbon film layer under the same film formation conditions as forming Carbon film layer 2 in Experiment 1, whereby a test sample (a carbon-coated sample) was manufactured. The film formation time of each layer was set to 1 hour.

Figure 7:
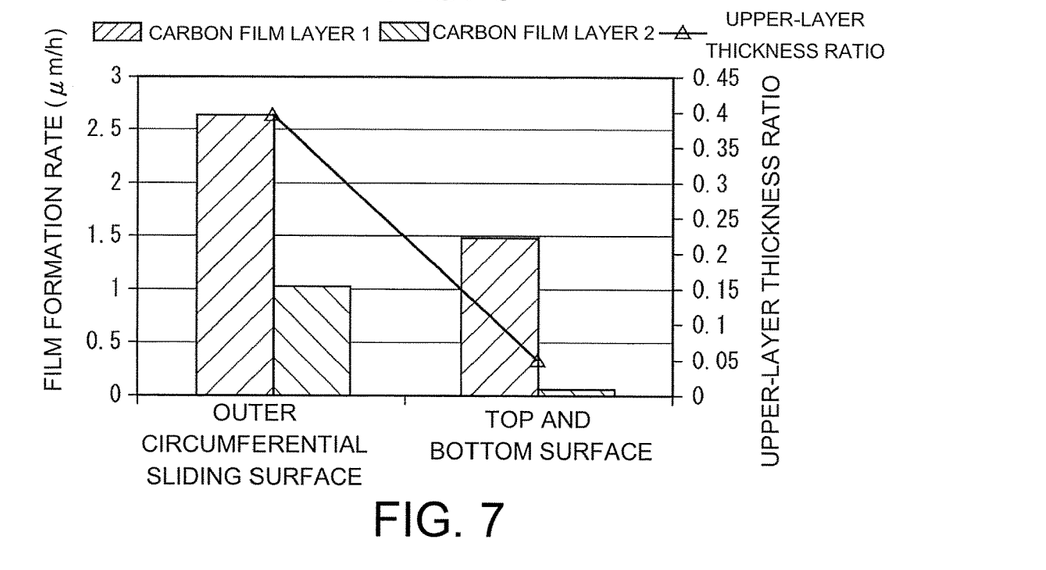
FIG. 7 is a diagram illustrating film formation rates of carbon film layers and upper-layer thickness ratios on an outer circumferential sliding surface and top and bottom surfaces according to an embodiment of the invention.

The thicknesses of the carbon film layers formed on the outer circumferential sliding surface and the top and bottom surface are described as film formation rates in Table 2 and FIG. 7. In Table 2, an upper-layer thickness layer which is a ratio of the thickness of the second carbon film layer to the thickness of the first carbon film layer and a ratio (an outer circumferential layer thickness ratio) of the thickness on the outer circumferential sliding surface to the thickness on the top and bottom surface for each carbon film layer, that is, the outer circumferential layer thickness ratio (the first outer circumferential layer thickness ratio) of the first carbon film layer and the outer circumferential layer thickness ratio (the second outer circumferential layer thickness ratio) of the second carbon film layer, are also described for the carbon films formed on the outer circumferential sliding surface and the top and bottom surface. In FIG. 7, the left vertical axis represents the film formation rate (μm/h) and the right vertical axis represents the upper-layer thickness ratio, which correspond to bar graphs and linear data.

TABLE 1

| | Treatment conditions (film formation conditions) | | | | | |
|---|---|---|---|---|---|---|
| | Source gas | Gas pressure | Substrate voltage | Discharge current | Friction coefficient | Hardness (GPa) |
| Carbon film layer 1 | Hydrocarbon gas A | 0.4 Pa | −500 V | 5 A | 0.121 | 22 |
| Carbon film layer 2 | Hydrocarbon gas B | 0.4 Pa | −500 V | 10 A | 0.105 | 18 |

4. Evaluation

As described in Table 1, it can be seen that Carbon film layer 2 exhibits a small friction coefficient and is a carbon film layer with low hardness.

On the other hand, it can be seen from Table 1 that Carbon film layer 1 exhibits a large friction coefficient. On the other hand, it can be seen that Carbon film layer 1 exhibits nanoindentation hardness of 20 GPa or more and excellent durability is secured.

[2] Experiment 2

In Experiment 2, a piston ring in which a first carbon film layer and a second carbon film layer are stacked to form a carbon film was manufactured and film qualities of the

TABLE 2

| | Film formation rate (μm/h) | | |
|---|---|---|---|
| | First carbon film layer (*1) | Second carbon film layer (*2) | Upper-layer thickness ratio (*2/*1) |
| Outer circumferential sliding surface (*3) | 2.7 | 1.1 | 0.40 |
| Top and bottom surface (*4) | 1.5 | 0.1 | 0.05 |

TABLE 2-continued

| | Film formation rate (μm/h) | | |
|---|---|---|---|
| | First carbon film layer (*1) | Second carbon film layer (*2) | Upper-layer thickness ratio (*2/*1) |
| Outer circumferential layer thickness ratio (*4/*3) | 0.56 | 0.09 | — |

From Table 2 and FIG. 7, it can be seen that the first carbon film layer is sufficiently formed on the top and bottom surface in the test sample and the thickness of the second carbon film layer on the top and bottom surface is smaller than the thickness of the second carbon film layer on the outer circumferential sliding surface outer circumferential sliding surface.

It can also be seen that the thickness of the first carbon film layer on the outer circumferential sliding surface and the top and bottom surface are larger than the thickness of the second carbon film layer and the upper-layer thickness ratio on the outer circumferential sliding surface is higher than the upper-layer thickness ratio on the top and bottom surface.

It can also be seen that the outer circumferential layer thickness ratio (the second outer circumferential layer thickness ratio) of the second carbon film layer is higher than the outer circumferential layer thickness ratio (the first outer circumferential layer thickness ratio) of the first carbon film layer.

2. Test Method

Figure 6:
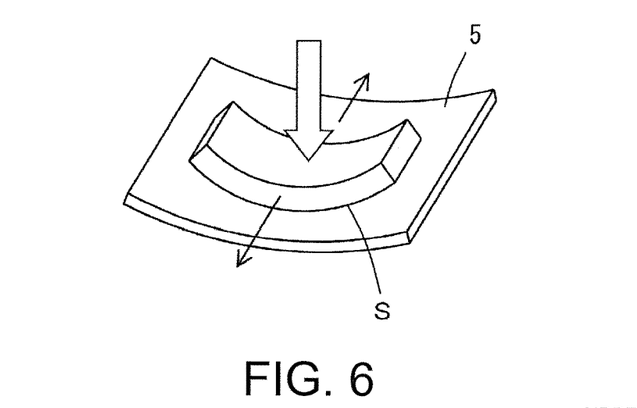
FIG. 6 is a perspective view illustrating a test method of a durability evaluation test.

Durability of the carbon films on the outer circumferential sliding surface and the top and bottom surface were evaluated on the basis of a durability evaluation test illustrated in FIG. 6. Specifically, one droplet (5 μl) of engine oil with viscosity SAE 0W-20 based on ILSAC GF-5 grade was dropped on a sliding surface, then a carbon film layer formation surface S of the outer circumferential sliding surface of the carbon-coated sample was caused to slide in a longitudinal direction indicated by an arrow with amplitude of 24 mm at 20 Hz while it was being pressed against a sleeve piece 5 cut out of a sleeve formed of cast iron with a load of 40 N in the atmosphere of 80° C., a time until the friction coefficient reaches 0.5 was measured as a burning time (a scuffing time), and durability was evaluated. The same measurement was performed on a piston ring of which the outer circumferential sliding surface was coated with CrN (a CrN-coated sample) and a piston ring of which the outer circumferential sliding surface was plated with Cr (a Cr-plated sample) and durability was evaluated.

3. Result

Figure 8:
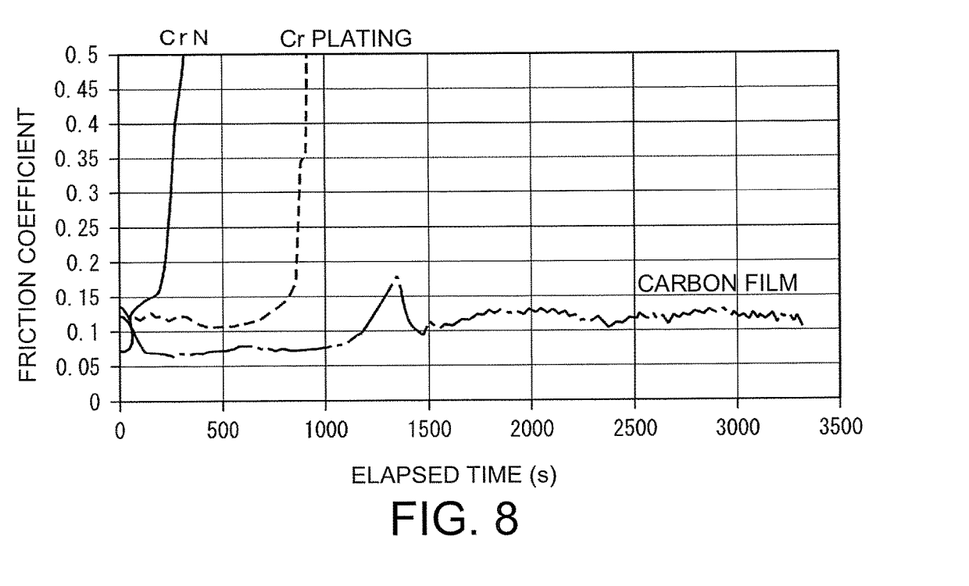
FIG. 8 is a diagram illustrating a test result of a durability evaluation test for the outer circumferential sliding surface.

Measurement results of each test are described in Table 3 and FIG. 8. In FIG. 8, the horizontal axis represents an elapsed time and the vertical axis represents a friction coefficient.

TABLE 3

| | Scuffing time (s) |
|---|---|
| Carbon-coated sample | Burning does not occur |
| CrN-coated sample | 380 |
| Cr-plated sample | 920 |

4. Evaluation

From Table 3 and FIG. 8, it can be seen that a carbon film having more excellent durability than CrN or Cr plating which is widely used as a coating of the piston ring was formed on the outer circumferential sliding surface.

[3] Experiment 3

In Experiment 3, changes in attackability and durability due to addition of Si to a carbon film layer were evaluated.

1. Manufacturing of Test Sample

Figure 9:
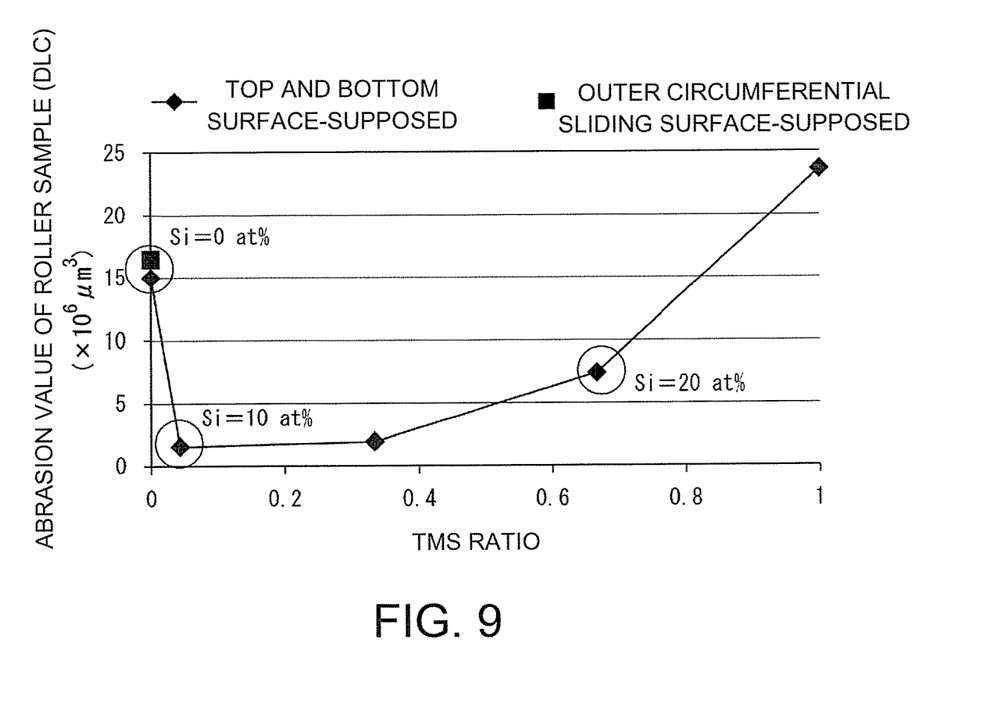
FIG. 9 is a diagram illustrating a relationship between a TMS ratio of a source gas and an abrasion amount of a carbon film.
Figure 10:
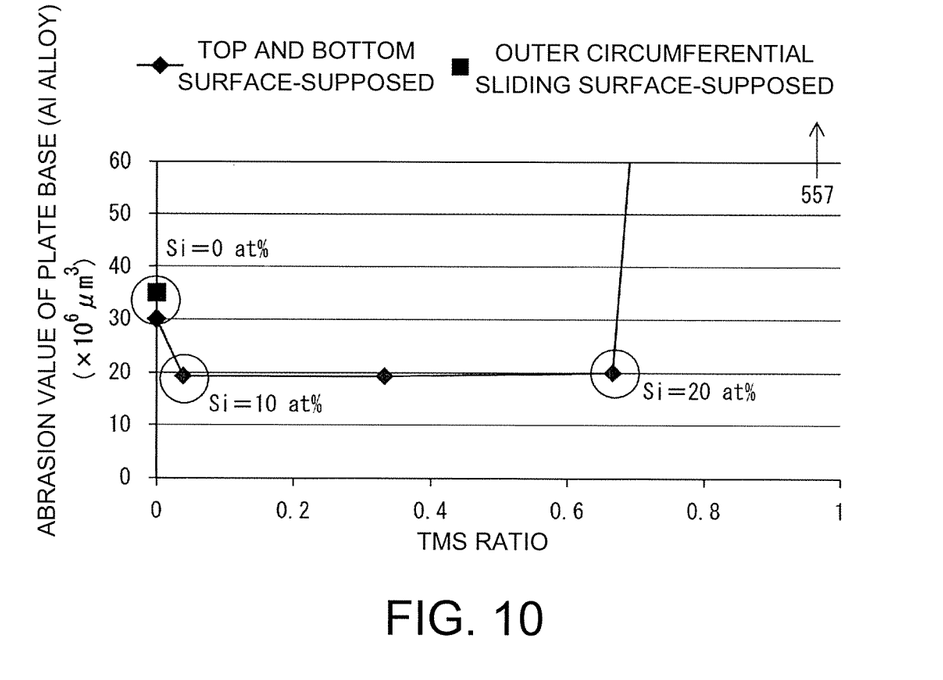
FIG. 10 is a diagram illustrating a relationship between a TMS ratio of a source gas and an abrasion amount of an opposite sliding member.

Five types of test samples (top and bottom surface-supposed roller samples) in which a first carbon film layer was formed under the same film formation conditions as in Experiment 1 except that the TMS ratio in source gas is changed to values indicated by rhomboids in FIGS. 9 and. 10 and then a second carbon film layer was formed under the same film formation conditions as in Experiment 1 were manufactured. The film formation time was also adjusted such that the thickness of the formed first carbon film layer was 1.5 μm in all the top and bottom surface-supposed roller samples and the thickness of the second carbon film layer was 0.1 μm in all the top and bottom surface-supposed roller samples.

A test sample (an outer circumferential sliding surface-supposed roller sample) in which the first carbon film layer was formed with a thickness of 2.7 μm under the same film formation conditions as in Experiment 1 and then the second carbon film layer was formed with a thickness of 1.1 μm under the same film formation conditions as in Experiment 1 was manufactured.

2. Test Method (1) Measurement of Abrasion Values of Roller Sample and Opposite Sliding Member when Opposite Sliding Member is Formed of Al Alloy Sliding was carried out in the same way as measuring the friction coefficient in Experiment 1, abrasion values of the plate substrate 4 which is an opposite sliding member and the carbon film layer with which a roller sample was coated were measured, and attackability and durability were evaluated. In this experiment, the material of the plate substrate 4 was changed to an Al alloy (A351).

(2) Measurement of Abrasion Values of Roller Sample in Lubricant Containing Mo-DTC As for the roller samples with TMS ratios of 0 and 0.66 among the top and bottom surface-supposed roller samples, a test in which 800 ppm of a Mo-DTC in terms of molybdenum (Mo) was added to the engine oil was additionally performed with plates formed of an Al alloy (A351) and SUJ-2 as opposite sliding members at the time of evaluation of Test method (1).

3. Result (1) Abrasion Values of Roller Sample and Opposite Sliding Member when Opposite Sliding Member is Formed of Al Alloy Abrasion value measurement results of the roller samples are illustrated in FIG. 9 and abrasion value measurement results of the plate substrates 4 are illustrated in FIG. 10.

Figure 11:
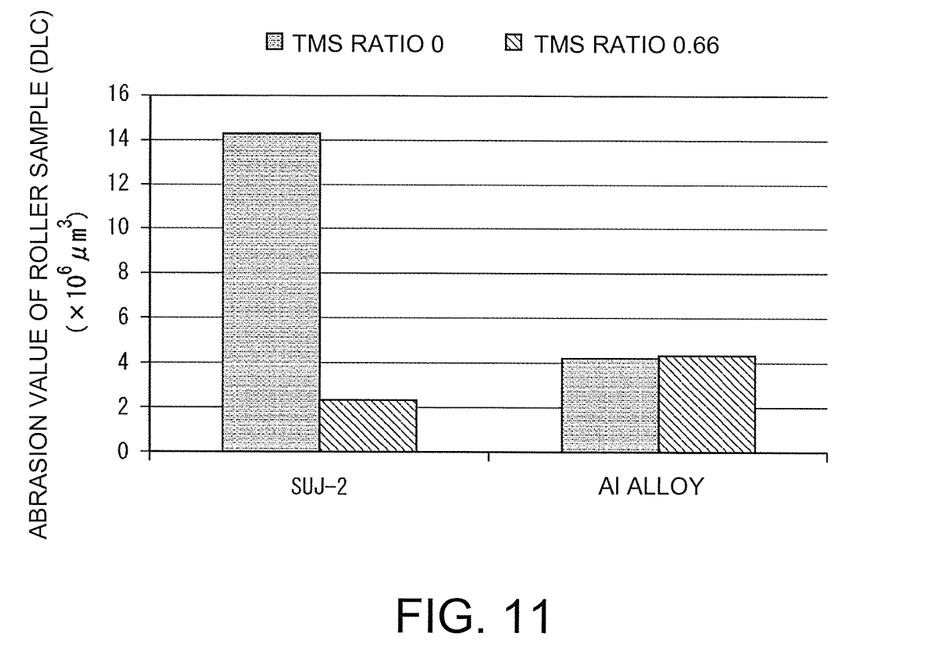
FIG. 11 is a diagram illustrating an abrasion amount of a carbon film in a lubricant containing a Mo-DTC.

(2) Measurement of Abrasion Values of Roller Sample in Lubricant Containing Mo-DTC Abrasion value measurement results of the roller samples are illustrated in FIG. 11.

4. Evaluation (1) Durability and Attackability when Opposite Sliding Member is Formed of Al Alloy From FIGS. 9 and 10, in the top and bottom surface-supposed roller samples, it can be seen that the abrasion values of the roller sample and the plate substrate decrease up to 10 at % when the Si content increases from 0 at %, the abrasion values increase when the Si content increases further, and the abrasion values of the roller sample and the plate substrate become greater than at 0 at % when the Si content becomes greater than 20 at %.

Accordingly, when the opposite sliding member is formed of an Al alloy, the Si content of the carbon film layer be equal to or less than 20 at % (the total content of C and H be equal to or greater than 80 at %).

Comparing the top and bottom surface-supposed roller sample with the outer circumferential sliding surface-supposed roller sample, it can be seen that the abrasion values of the roller sample and the plate substrate are smaller on the top and bottom surface-supposed roller sample and durability and attackability are excellent.

Accordingly, an opposite sliding member is often formed of an Al alloy, the film quality of the top and bottom surface-supposed roller sample is more excellent as a coating of the top and bottom surface.

(2) Durability in Lubricant Containing Mo-DTC

It can be seen from FIG. 11 that the top and bottom surface-supposed roller sample not containing Si is much abraded when it is caused to slide over a plate formed of SUJ-2 in a lubricant containing a Mo-DTC, but is abraded to the same degree as the top and bottom surface-supposed roller sample containing Si when it is caused to slide over a plate formed of an Al alloy.

Accordingly, when an opposite sliding member is formed of an Al alloy, a carbon film layer not containing Si can be used in a lubricant containing a Mo-DTC.

From the above-mentioned experiment results, it was confirmed that by appropriately selecting an arrangement method of the piston ring in the chamber, film formation conditions, and a film formation method and adjusting favorability and disfavorability of deposition for each formation of a carbon film when a carbon film is formed on the outer circumferential sliding surface and the top and bottom surface of a piston ring, the thickness ratios of the carbon film layers can be changed on the outer circumferential sliding surface and the top and bottom surface when the carbon film is formed on the outer circumferential sliding surface and the top and bottom surface under the same method and the same conditions, and the film qualities of the carbon films formed on the outer circumferential sliding surface and the top and bottom surface can be controlled depending on the film qualities of the carbon film layers and the thickness ratios of the carbon films.

[4] Experiment 4

In Experiment 4, friction coefficients of various carbon film layers having different Raman coefficients in a base oil were evaluated.

1. Manufacturing of Test Sample

A substrate in which a Ti layer with a thickness of 0.6 pin was formed on a ring formed of stainless nitride steel by sputtering was coated with an Si-DLC layer with a thickness of 0.6 μm as an adhesion layer by CVD method using a TMS and a mixed gas of $C_2$ and $H_2$.

Subsequently, as described in Table 7, film formation conditions such as a coil current and a bias voltage were changed and carbon film layers were formed. The total thickness after being formed, the film formation rates of the carbon film layers, and a jig temperature in the vicinity of the substrate are described together in Table 7. In Table 7, samples (test samples) with branch numbers of No. 1-1, No. 1-2, and the like are samples which were manufactured with the same arrangement and with changed set positions, that is, samples with different set heights of the substrate.

2. Test Method (1) Raman Measuring Method and Raman Coefficient Calculating Method a. Measurement Conditions Used device: NRS-5100 made by JASCO Corp.

Excitation wavelength: 532 nm

Grating: 1800 l/m

Measurement range: centered on 1400 $cm^{-1}$ (874 to 1873 $cm^{-1}$)

Laser intensity, measurement time: range in which the film quality of the carbon film layer is not changed b. Raman Coefficient Calculating Method A Raman coefficient calculating procedure will be described below with reference to the Raman spectrum (Sample No. 2) illustrated in FIG. 12 which is obtained under the above-mentioned measurement conditions.

Figure 12:
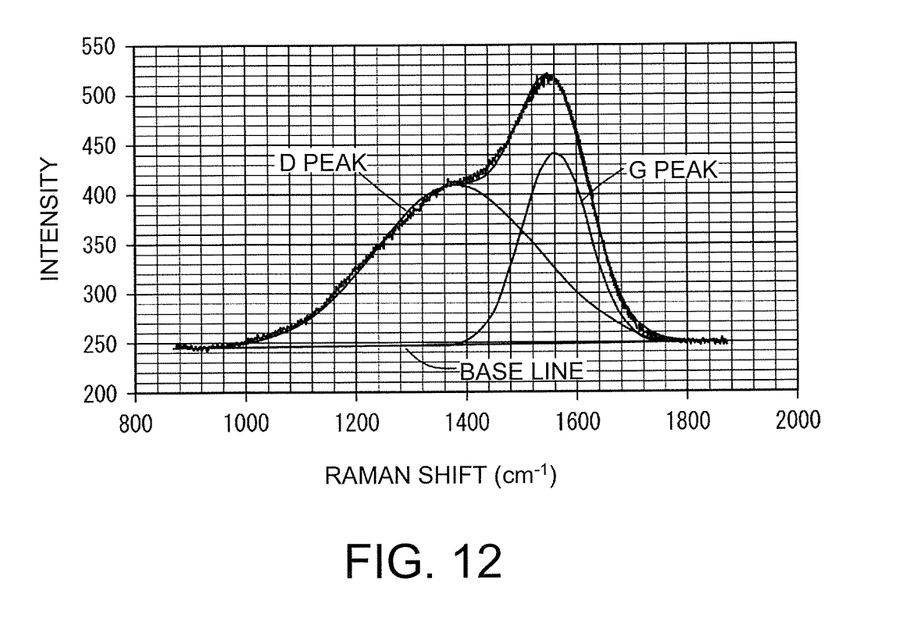
FIG. 12 is a diagram illustrating a method of calculating a Raman coefficient.

First, a straight line connecting positions with low intensities in the vicinity of 900 $cm^{-1}$ and in the vicinity of 1800 $cm^{-1}$ is drawn and is set as a base line. Subsequently, a Gaussian function is applied to two peaks of a D peak (in the vicinity of 1350 $cm^{-1}$) and a G peak (in the vicinity of 1550 $cm^{-1}$) to separate peaks and a Raman coefficient at a half-value width and a peak position of the G peak acquired by the peak separation is calculated by the following equation.

$$\text{Raman coefficient}=10^6 \div (\text{peak position} \times 1.08 + \text{half-value width}) - 510$$

peak position: wavelength at vertex of G peak ($cm^{-1}$)

half-value width: half-value width of G peak ($cm^{-1}$).

(2) Measurement of Friction Coefficient

The friction coefficient was measured under the following sliding conditions.

Opposite sliding member: sleeve piece formed of an aluminum alloy

Lubricant: base oil

Load: 60 N

Speed: 600 rpm

Time: 10 minutes

Temperature: 120° C.

The set state at the time of the sliding test is almost the same as the state illustrated in FIG. 6.

3. Evaluation Result

Figure 13:
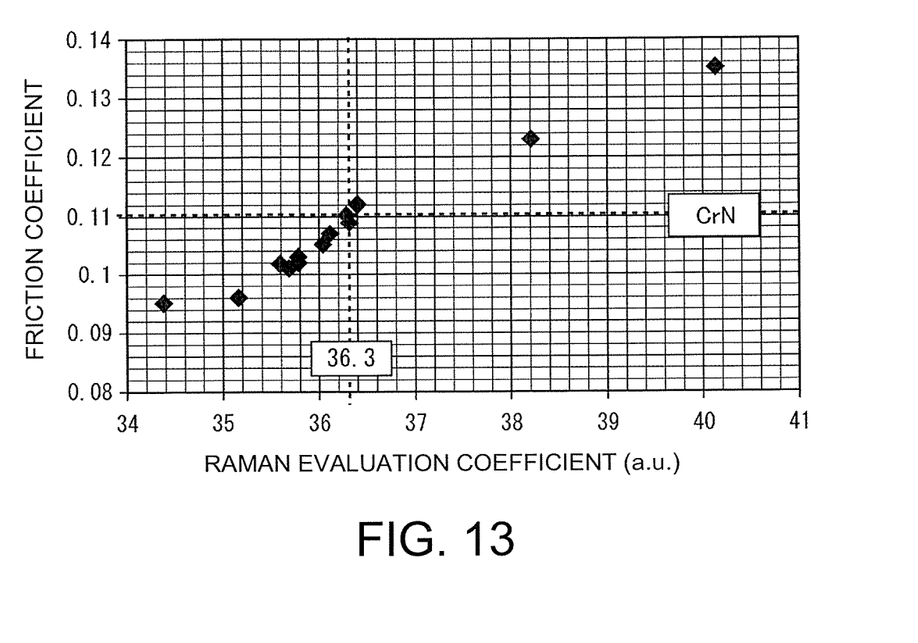
FIG. 13 is a diagram illustrating a relationship between a Raman coefficient and a friction coefficient of a second carbon film layer in an embodiment of the invention.

The half-value width and the peak position of the G peak, the Raman coefficient, and the friction coefficient along with the friction coefficient of CrN are described in Table 4. A relationship between the friction coefficient and the Raman coefficient with the vertical axis set to the friction coefficient and the horizontal axis set to the Raman coefficient (Raman evaluation coefficient, unit: a.u.) is illustrated in FIG. 13.

TABLE 4

| sample (unit) | Coil current (A) | Bias voltage (V) | Discharge current (A) | Ar (ccm) | $C_2H_2$ (ccm) | $CH_4$ (ccm) | Gas pressure (Pa) | Total thickness (μm) | Film formation rate of carbon film layer (μm/h) | Jig temperature around base (° C.) | G peak half-value width $(cm^{-1})$ | G peak position $(cm^{-1})$ | Raman evaluative coefficient (a.u.) | Friction coefficient |
|---|---|---|---|---|---|---|---|---|---|---|---|---|---|---|
| No. 1-1 | 8 | −500 | 10 | 40 | 0 | 160 | 0.4 | 9.55 | 0.9 | 210 | 156.9 | 1549.6 | 36.3 | 0.109 |
| No. 1-2 | 8 | −500 | 10 | 40 | 0 | 160 | 0.4 | 5.57 | 0.5 | 168 | 161.7 | 1546.0 | 36.0 | 0.105 |
| No. 2 | 9.5 | −500 | 10 | 40 | 0 | 160 | 0.4 | 12.3 | 1.3 | 241 | 144.0 | 1561.2 | 36.4 | 0.112 |
| No. 3 | 9.5 | −500 | 10 | 40 | 0 | 160 | 0.4 | 6.2 | 0.6 | 232 | 150.6 | 1556.0 | 36.1 | 0.107 |
| No. 4-1 | 9.5 | −300 | 10 | 40 | 0 | 160 | 0.4 | 4.25 | 0.5 | 154 | 177.2 | 1530.9 | 36.3 | 0.110 |
| No. 4-2 | 9.5 | −300 | 10 | 40 | 0 | 160 | 0.4 | 4.85 | 0.5 | 182 | 178.3 | 1531.4 | 35.8 | 0.103 |
| No. 4-3 | 9.5 | −300 | 10 | 40 | 0 | 160 | 0.4 | 2.88 | 0.3 | 142 | 178.9 | 1531.2 | 35.7 | 0.101 |
| No. 5-1 | 9.5 | −450 | 10 | 40 | 0 | 160 | 0.4 | 6.25 | 0.6 | 204 | 166.3 | 1546.9 | 34.4 | 0.095 |
| No. 5-2 | 9.5 | −450 | 10 | 40 | 0 | 160 | 0.4 | 6.2 | 0.6 | 168 | 162.8 | 1547.7 | 35.2 | 0.096 |
| No. 6 | 15 | −450 | 10 | 40 | 0 | 160 | 0.4 | 8.15 | 0.9 | 224 | 154.0 | 1554.6 | 35.6 | 0.102 |
| No. 7 | 9.5 | −300 | 10 | 40 | 150 | 0 | 0.4 | 6.25 | 11.2 | 166 | 166.4 | 1534.9 | 38.2 | 0.123 |
| No. 8 | 9.5 | −100 | 10 | 40 | 150 | 0 | 0.4 | 6.45 | 12.6 | 166 | 168.0 | 1527.5 | 40.1 | 0.135 |
| No. 9 | 9.5 | −550 | 10 | 40 | 120 | 0 | 0.2 | 3.5 | 4.8 | 166 | 169.5 | 1539.6 | 35.8 | 0.102 |
| CrN | | | | | | | | | | | | | | 0.110 |

As described in Table 4, in this experiment, various carbon film layers with Raman coefficients of 34.4 to 40.1 were formed as a carbon film layer. It can be seen from FIG. 13 that the friction coefficient and the Raman coefficient have a clear correlation close to a linear line and it can be seen from Table 4 and FIG. 13 that the friction coefficient is less than 0.110 of CrN when the Raman coefficient is equal to or less than 36.3. Accordingly, when the material of a sleeve is an Al alloy, it is preferable that the Raman coefficient of the second carbon film layer be equal to or less than 36.3.

While embodiments of the invention have been described above, the invention is not limited to the embodiments. Within the scope equal to or equivalent to the invention, the embodiments can be modified in various forms.

What is claimed is:

1. A piston ring, comprising:
a carbon film, formed on an outer circumferential sliding surface and top and bottom surfaces of a piston ring body,
wherein the carbon film is formed by stacking at least a first carbon film layer and a second carbon film layer with different film qualities, and
a thickness ratio of the first carbon film layer to the second carbon film layer is different between the outer circumferential sliding surface and the top and bottom surfaces,
a nanoindentation hardness of the first carbon film layer is equal to or greater than 15 GPa,
a Raman coefficient of the second carbon film layer which is calculated from the following equation on the basis of a Raman spectrum is equal to or less than 36.3, Raman coefficient=$10^6$÷(peak position×1.08+half-value width)−510 peak position: wavelength at vertex of G peak $(cm^{-1})$
half-value width: half-value width of G peak $(cm^{-1})$.

2. The piston ring according to claim 1, wherein the carbon film is formed by stacking the first carbon film layer formed on the piston ring body and the second carbon film layer formed on the first carbon film layer,
a thickness of the second carbon film layer on the top and bottom surfaces is smaller than a thickness of the second carbon film layer on the outer circumferential sliding surface, and
a ratio of the thickness of the second carbon film layer to the thickness of the first carbon film layer is larger on the outer circumferential sliding surface than on the top and bottom surfaces.

3. The piston ring according to claim 2, wherein the thickness of the first carbon film layer on the top and bottom surfaces is larger than the thickness of the second carbon film layer.

4. The piston ring according to claim 2, wherein at least the first carbon film layer is a carbon film layer which is formed using plasma CVD.

5. The piston ring according to claim 4, wherein the first carbon film layer and the second carbon film layer are formed on two or more piston rings which are arranged in a chamber using plasma CVD such that the top and bottom surfaces are parallel to each other under a condition in which a second outer circumferential layer thickness ratio is larger than a first outer circumferential layer thickness ratio,
wherein the second outer circumferential layer thickness ratio is a ratio of the thickness on the outer circumferential sliding surface of the second carbon film layer to the thickness on the top and bottom surfaces of the second carbon film layer, and the first outer circumferential layer thickness ratio is a ratio of the thickness on the outer circumferential sliding surface of the first carbon film layer to the thickness on the top and bottom surfaces of the first carbon film layer.

6. The piston ring according to claim 5, wherein the first carbon film layer and the second carbon film layer are formed by arranging a part of the top and bottom surfaces or inner circumferential surfaces of the two or more piston rings in a state of being held by a holder.

7. The piston ring according to claim 5, wherein at least the second carbon film layer of the first carbon film layer and the second carbon film layer is formed using plasma CVD equipment other than a self-discharge type.

8. The piston ring according to claim 7, wherein PIG discharge plasma CVD equipment is used as a coating device.

9. The piston ring according to claim 4, wherein the second carbon film layer is formed using any one of PVD of sputtering or ion plating in a state in which the piston ring body is arranged such that the outer circumferential sliding surface is perpendicular to an ion flow from a plasma source and the top and bottom surfaces are parallel to the ion flow.

10. The piston ring according to claim 1, wherein a metal layer containing titanium or chromium is formed on a surface of the piston ring using sputtering before the carbon film is formed.

11. The piston ring according to claim 1, wherein a carbon layer containing silicon is formed using CVD using a mixed gas containing a silane-based gas before the carbon film is formed.

12. The piston ring according to claim 1, wherein, before the carbon film is formed, a metal layer containing titanium or chromium is formed on a surface of the piston ring using sputtering and then a carbon film layer containing silicon is formed thereon using CVD using a mixed gas containing a silane-based gas.

13. The piston ring according to claim 1, wherein a material of an opposite member which slides over at least one of the outer circumferential sliding surface and the top and bottom surfaces of the piston ring is an aluminum alloy.

14. The piston ring according to claim 13, wherein the piston ring is used in an environment in which a lubricant containing a sulfurized molybdenum dialkyldithiocarbamate is used.

15. An engine comprising the piston ring according to claim 1.

\* \* \* \* \*